(12) United States Patent
Williams et al.

(10) Patent No.: US 6,666,997 B2
(45) Date of Patent: Dec. 23, 2003

(54) METHOD FOR REMOVING CLEANING COMPOUND FLASH FROM MOLD VENTS

(75) Inventors: Vernon M. Williams, Meridian, ID (US); Michael D. Gifford, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/970,199

(22) Filed: Oct. 2, 2001

(65) Prior Publication Data

US 2003/0062603 A1 Apr. 3, 2003

(51) Int. Cl.[7] .................. B29C 33/72; B29C 70/70; B29C 45/14; B08B 7/04
(52) U.S. Cl. .................. 264/39; 264/161; 264/272.11; 264/272.17; 264/276
(58) Field of Search ............... 264/39, 272.13, 264/272.14, 272.15, 272.17, 161, 276, 337, 338, 273, 274; 425/116, 544, 812, 806; 134/4, 5, 42

(56) References Cited

U.S. PATENT DOCUMENTS

| | | | | | |
|---|---|---|---|---|---|
| 3,659,821 A | * | 5/1972 | Sakamoto et al. | ............ | 249/84 |
| 3,911,075 A | * | 10/1975 | Boesch et al. | ........... | 264/328.5 |
| 3,969,461 A | * | 7/1976 | Boesch et al. | ............... | 264/163 |
| 4,132,856 A | * | 1/1979 | Hutchison et al. | ......... | 174/52.2 |
| 4,653,993 A | * | 3/1987 | Boschman | .................. | 425/116 |
| 4,862,586 A | * | 9/1989 | Osada | .......................... | 29/827 |
| 5,071,612 A | * | 12/1991 | Obara | ......................... | 264/161 |
| 5,431,854 A | * | 7/1995 | Pas | .......................... | 264/328.5 |
| 5,542,171 A | * | 8/1996 | Juskey et al. | .................. | 29/840 |
| 5,961,912 A | * | 10/1999 | Huang et al. | ........... | 264/272.15 |
| 6,319,450 B1 | * | 11/2001 | Chua et al. | ............ | 264/272.17 |
| 6,468,361 B1 | * | 10/2002 | Cantillep | ..................... | 134/18 |

\* cited by examiner

Primary Examiner—Angela Ortiz
(74) Attorney, Agent, or Firm—Dorsey & Whitney LLP

(57) ABSTRACT

An integrated circuit leadframe is specially adapted to adhere to injection mold cleaning compounds in the area of vents for an injection mold. An area of a leadframe rail that is normally positioned adjacent a mold vent is provided with apertures, surface roughness or a surface coating to cause the cleaning compound to more tightly adhere to the leadframe rail. As a result, cleaning compound flash is removed from the vents when the leadframe is removed from the mold.

31 Claims, 5 Drawing Sheets

METHOD FOR REMOVING CLEANING COMPOUND FLASH FROM MOLD VENTS

TECHNICAL FIELD

This invention related to injection molding of integrated circuit packages, and, more particularly, to a device and method for facilitating the removal of cleaning compound from integrated circuit injection molds.

BACKGROUND OF THE INVENTION

As shown in FIG. 1, integrated circuits are typically encapsulated in a package 10 of a suitable material, such as epoxy, from which conductive leads 12 project. Although the leads 12 are shown in FIG. 1 as being conductors that project laterally and then downwardly, other lead configurations are in common use.

The encapsulation of the integrated circuit is typically performed by placing the integrated circuit in a mold then injecting a molding compound into the mold. A typical integrated circuit injection mold 20 is shown in FIG. 2. The mold 20 includes a rectangular upper mold section 26 and a matching lower mold section 28, each of which have a series of mold cavities 36, 38, respectively, formed in respective adjoining mold surfaces 30, 32. Each of the adjoining pairs of mold cavities 36, 38 generally encapsulate a single integrated circuit, although it is possible to encapsulate several interconnected integrated circuits in a single mold cavity pair. Eight mold cavities 36, 38 are shown in FIG. 2, but a greater or lesser number of mold cavities may be formed in conventional mold sections. The mold cavities 36, 38 are typically rectangular to match the desired shape of the integrated circuit package 10 (FIG. 1), but other shapes are also possible.

In practice, before the integrated circuits are placed in respective pairs of mold cavities 36, 38, they are attached to a leadframe, and the integrated circuit and leadframe are placed between the mold sections 26, 28. A typical leadframe 40 is shown in FIG. 3A. The leadframe 40 includes several leadframe sections 44 corresponding in number to the number of pairs of mold cavities 36, 38, and corresponding in size and shape to the size and shape of the mold cavities 36, 38. A single leadframe section 44 is shown in FIG. 3B. With reference to FIG. 3B, each leadframe section 44 includes a central mounting plate 46 to which an integrated circuit 48 is mounted by suitable means, such as adhesive tape (not shown). Each leadframe section 44 also includes a plurality of inner leads 50 projecting from each side of the central mounting plate 46 to a respective gasket strip 52, and a plurality of outer leads 56 aligned with respective inner leads 50 extending from the gasket strips 52. The outer leads 56 are what eventually form the leads 12 shown in FIG. 1. The leadframe 40 also includes leadframe rails 60, 62 extending along the longitudinal edges of the leadframe 40. Although not shown in the Figures, after the package 10 has been formed, the portions of the gasket strips 52 between the leads 50, 56 are removed to electrically isolate the leads 50, 56 from each other, and the outer leads 56 are bent downwardly as shown in FIG. 1 to form the leads 12.

The leadframe 40 to which the integrated circuit 48 is attached is placed in the mold 20 between the mold sections 26, 28, with each leadframe section 44 aligned with a respective pair of mold cavities 36, 38. The leadframe 40 is also placed in the mold 20 so that the gasket strips 52 and leadframe rails 60 extend around the cavities 36, 38 in contact with the mold surfaces 30, 32 so that the leadframe 40 acts as a gasket to retain material within the cavities 36, 38.

After the leadframe and integrated circuit 48 have been placed in the mold 20, a molding compound is injected into each pair of the cavities 36, 38 through a respective injection inlet 70 (FIG. 2) provided for each pair of mold cavities 36, 38 at one edge thereof. The injection inlets are formed in either or both of the mold sections 26, 28. The injection inlets 70 provide a path for the molding compound, generally an epoxy compound, to be injected into the mold cavities 26, 28. The molding compound attempts to displace air in the mold cavities 36, 38, and this air must therefore be vented from the cavities 36, 38. For this purpose, mold vents 74 are formed in either or both of the mold sections 26, 28 through an edge of each pair of mold cavities 36, 38 opposite the injection inlets 70.

In practice, before the mold 20 can be used, it must be prepared by injecting a conditioning compound into the mold cavities 36, 38. The conditioning compound contains release agents to make the surfaces of the mold cavities 36, 38 slippery so that the integrated circuit packages 10 (FIG. 1) can be removed from the mold cavities 36, 38 after being molded. Although the molding compound also contains release compounds, the molding compound does not contain a sufficient quantity for initial use of the mold. The conditioning compound is normally injected into the mold cavities 36, 38 after a leadframe has been inserted between the mold sections 26, 28. The leadframe 40 serves as a gasket to retain the conditioning compound in the cavities 36, 38. Also, since the conditioning compound surrounds the leadframe 40 within the mold cavities 36, 38, removal of the leadframe 40 effectively removes the conditioning compound from the mold cavities 36, 38.

After the mold 20 has been used to mold a large number of integrated circuit packages 10, typically on the order of 500–2,500 packages, the release compound in the molding compound and possibly other components in the molding compound build up as deposits on the surfaces of the mold cavities 36, 38. These deposits must be removed to prevent the molding compound from sticking to the surfaces of the cavities 36, 38 and thereby damaging the integrated circuit packages 10 (FIG. 1). These deposits are removed by injecting a cleaning compound into the mold cavities 36, 38. The cleaning compound is injected through the injection inlets 70 to displace all of the air in the mold cavities 36, 38 until some cleaning compound starts to exit the vents 74. The cleaning compound is somewhat "sticky" so that the cleaning compound adheres well to the deposits, thus allowing the deposits to be removal by simply removing the cleaning compound from the mold cavities 36, 38. The cleaning compound is also typically relatively viscous, contains cleaning chemicals and abrasives, and shrinks after cooling to draw the deposits from the surfaces of the mold cavities 36, 38.

The leadframe performs the same two functions during the cleaning process that it performs in the conditioning process. First, as previously explained, it forms a gasket between the mold sections 26, 28. Without a leadframe between the mold sections 26, 28, the cleaning compound could leak from between the mold sections 26, 28. Second, the cleaning compound adheres to the leadframe so that the cleaning compound is removed from the mold 20 along with the leadframe. The leadframe thus facilitates the removal of cleaning compound from the mold cavities 36, 38.

Although removal of the leadframe adequately removes the cleaning compound from the mold cavities 36, 38, some cleaning compound residue, known as "flash," tends to remain in the vents 74. Yet substantially all of the cleaning compound flash must be removed from the vents 74 before the mold 20 can be used to mold integrated circuit packages 10. If the flash is not removed from the vents 74, molding compound injected through the injection inlet 70 will be unable to displace air in the mold cavities 36, 38. Cleaning compound flash in the vents 74 is conventionally removed by a laborious and time-consuming process of manually scraping shreds of flash from the vents 74 using a pointed tool (not shown). During the time the flash is being removed from the vents 74, the injection molding machine containing the mold 20 cannot be used to mold integrated circuit packages 10. As a result, the throughput of the molding machine can be reduced significantly. Furthermore, the mold 20 is typically very hot after it has been placed in the injection molding machine so the cleaning compound can be injected into the mold cavities 36, 38. The high temperature of the mold 20 can injure workers manually removing the flash, and the high degree of care required to avoid injury further increases the time required to manually remove the flash from the vents 74. Also, the tool normally used to remove the cleaning compound is fairly sharp, and, as a result, can damage the mold, thus making expensive repair or replacement of the mold necessary.

There is therefore a need for a device and method that is capable of removing cleaning compound flash from injection mold vents that avoids the laborious and time-consuming manual removal of cleaning compound flash.

SUMMARY OF THE INVENTION

A leadframe is adapted for use with an injection mold having a plurality of mold cavities, an injection inlet on one side of each mold cavity and a mold vent on the opposite side of each mold cavity. The leadframe includes a pair of leadframe rails extending along opposite sides of the leadframe. Attachment areas are formed on areas of the leadframe rails that are adjacent the mold vents when the leadframe is inserted into the mold. The attachment areas have properties that cause the attachment areas to adhere relatively well to a material, such as a cleaning compound, that may form a residue or "flash" that lodges in the mold vents. The attachment areas may be formed on either or both leadframe rails and/or on one or both surfaces of the leadframe rail. The attachment areas may comprise one or more apertures in the leadframe rail, an area of surface treatment, such as roughening, on the leadframe rail, or a layer of a material that adheres well to the material forming the flash.

DETAILED DESCRIPTION OF THE INVENTION

Figure 1:
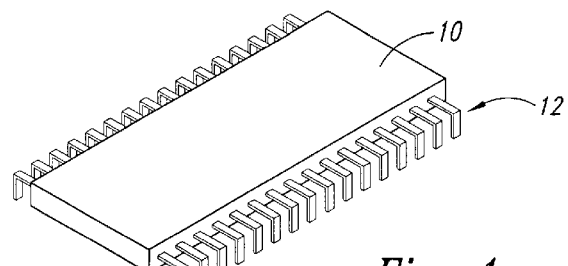
FIG. 1 is an isometric view of a conventional integrated circuit package.
Figure 2:
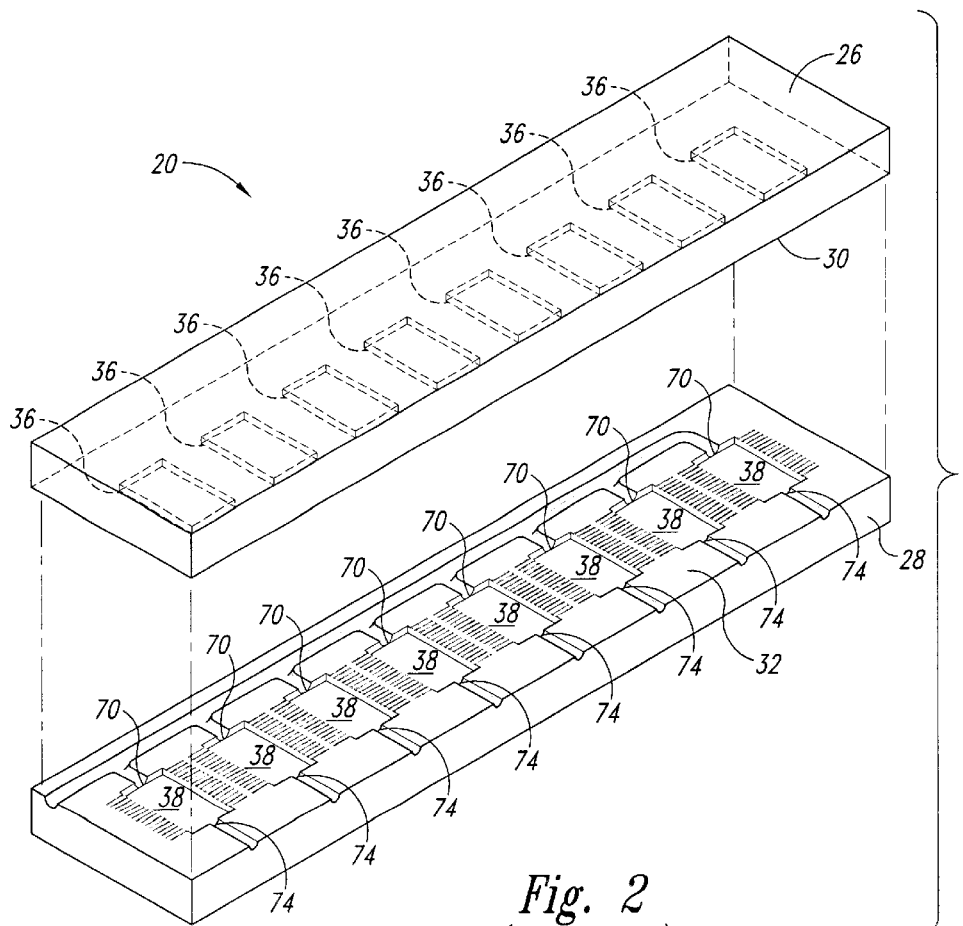
FIG. 2 is an exploded isometric view of an injection mold used to mold integrated circuit packages.
Figure 3A:
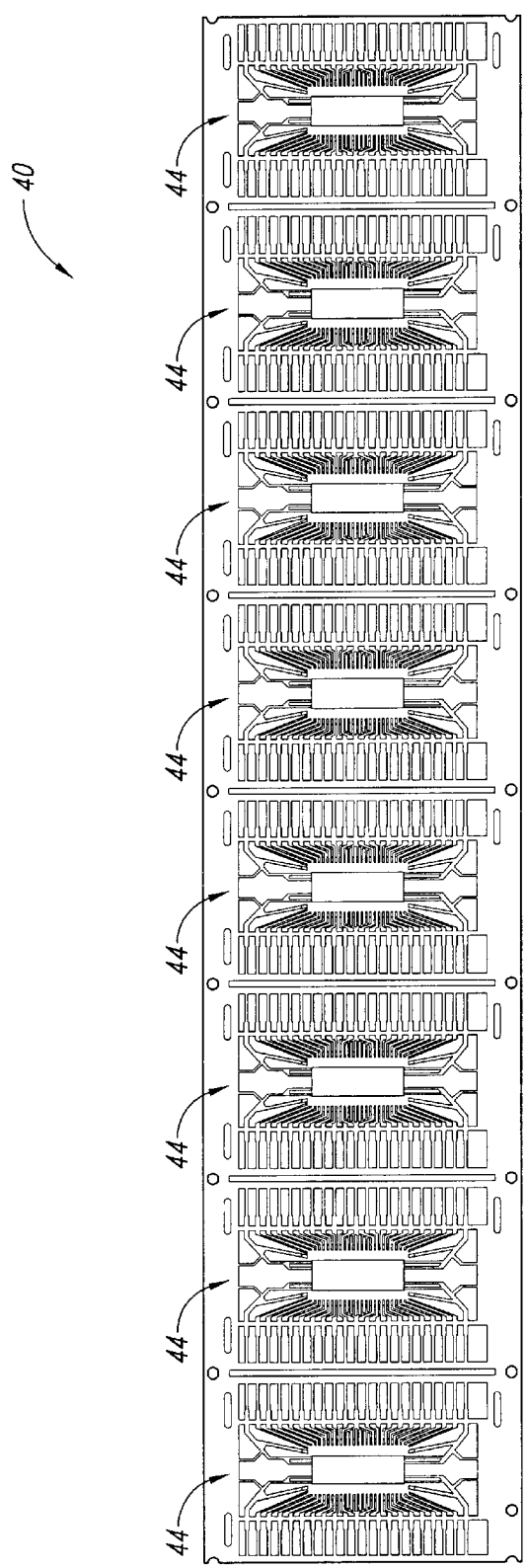
FIGS. 3A and 3B are top plan views of a conventional lead frame used in the injection mold of FIG. 2 to mold integrated circuit packages of the type shown in FIG. 1.
Figure 3B:
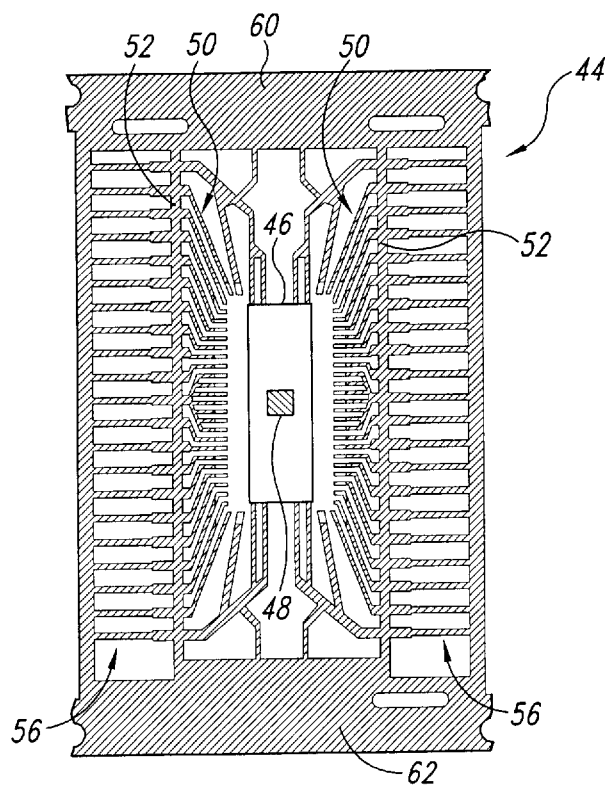
Figure 4:
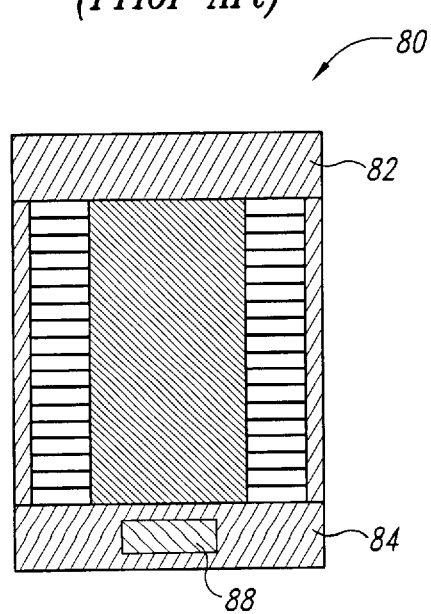
FIG. 4 is an isometric view of a leadframe section according to one embodiment of the invention that facilitates the removal of cleaning compound from mold vents in the mold of FIG. 2.

One embodiment of a leadframe 80 that facilitates the removal of cleaning compound flash from mold vents like the vents 74 shown in FIG. 2 is shown in FIG. 4. Many of the features of the leadframe 80 are identical to those of the leadframe 40 shown in FIG. 3. Therefore, in the interest of brevity, these features have been provided with the same reference numerals, and an explanation of the structure and function of these features will not be repeated.

The effectiveness of the leadframe 80 is based on the discovery that the solid rails 60, 62 (FIG. 3) found on conventional leadframes, like the leadframe 40 shown in FIG. 3, do not adequately bond to the cleaning compound in the area of the mold vents 74. As a result, cleaning compound flash can be left in the vents 74. The leadframe 80 shown in FIG. 4 differs from the conventional leadframe 40 of FIG. 3 by having a leadframe rail 84 positioned adjacent the mold vents 74 that has formed therein or thereon a cleaning compound attachment area 88. The attachment area 88 is specifically adapted to cause the cleaning compound to adhere well to the rail 84 in the area of the rail 84 adjacent the mold vents 74. This relatively strong attraction between the cleaning compound and the attachment area 88 causes any cleaning compound in the mold vents 74 to be removed with the cleaning compound in the mold cavities 36, 38 as the leadframe 80 is removed from the mold 20. As a result, little or no cleaning compound flash is left in the vents 74, thereby eliminating or significantly reducing the need for the laborious, time and possibly unsafe manual removal of cleaning compound flash from the vents 74.

Figure 5:
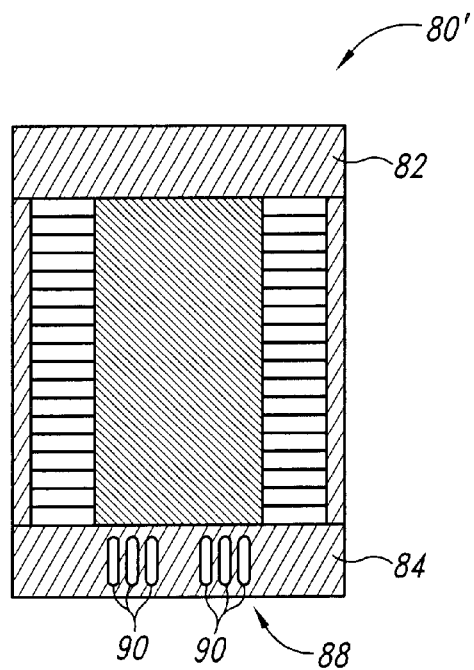
FIG. 5 is an isometric view of one embodiment of the leadframe section of FIG. 4 according to the present invention.

In one embodiment 80' of the leadframe 80, the cleaning compound attachment area 88 comprises apertures 90 in the leadframe rail 84, as shown in FIG. 5. The apertures 90 may be formed by any means, such as by stamping, etching, laser cutting, or by other means. The apertures 90 are filled with cleaning compound during the cleaning process so that the cleaning compound is held against opposite surfaces of the leadframe rail 84 by cleaning compound extending through the apertures 90. As a result, the cleaning compound is more securely attached to the leadframe rail 84. The cleaning compound is therefore able to pull the cleaning compound from the vents 74, rather than the attachment between the cleaning compound in the vents 74 causing the cleaning compound to separate from the leadframe rail 84. Although the apertures 90 are shown in FIG. 5 as being elongated transversely to the longitudinal axis of the rail 84, the apertures 90 may have other shapes or orientations. Further, although the apertures 90 are shown in FIG. 5 as being arranged in two groups each containing three apertures 90, different numbers of apertures grouped in any manner may alternatively be used.

Figure 6:
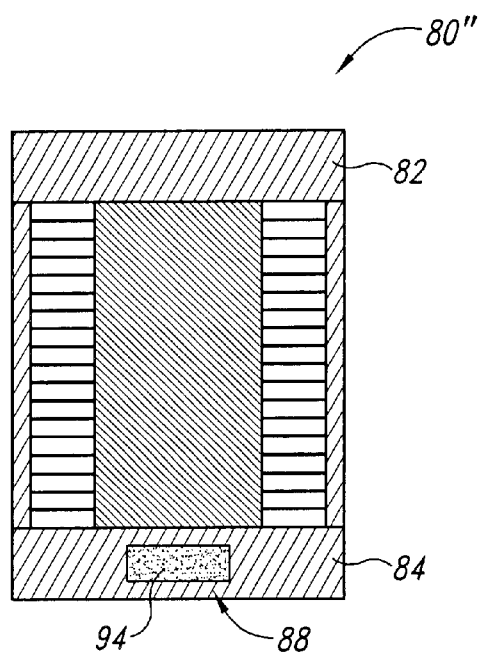
FIG. 6 is an isometric view of another embodiment of the leadframe section of FIG. 4 according to the present invention.

Another embodiment of a leadframe 80" according to the present invention is shown in FIG. 6. The leadframe 80" uses as the cleaning compound attachment area 88 a surface treatment area 94 of the leadframe rail 84. In the embodiment shown in FIG. 6, the surface treatment area 94 has a surface roughness formed by mechanical, chemical, or some other means. The surface treatment area 94 causes the cleaning compound to be more securely attached to the leadframe rail 84 so the cleaning compound is able to pull the cleaning compound from the vents 74. As a result, there is little or no cleaning compound flash remaining in the vents 74 after the cleaning process. The roughened surface treatment area 94 may be formed on either or both surfaces of the leadframe rail 84 depending on the locations of the vents 74 and the desired degree of adhesion between the leadframe rail 84 and the cleaning compound.

Figure 7:
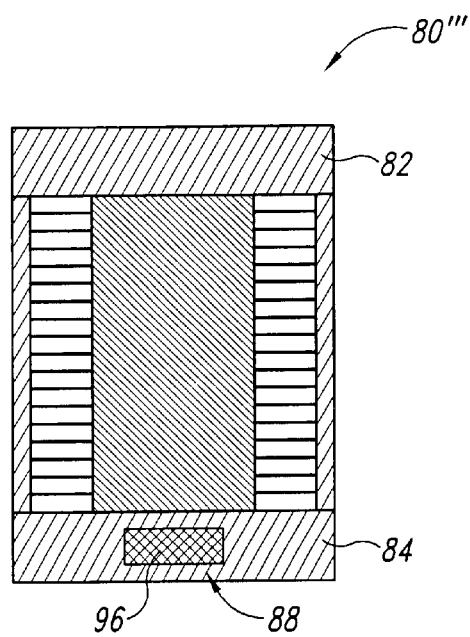
FIG. 7 is an isometric view of still another embodiment of the leadframe section of FIG. 4 according to the present invention.

Still another embodiment of a leadframe 80''' according to the present invention is shown in FIG. 7. The leadframe 80''' uses as the cleaning compound attachment area 88 a surface treatment area 96 of the leadframe rail 84 formed from a different material from the remainder of the rail 84. The surface treatment area 96 may be formed by any means, such as by coating an area of the rail 84 with a suitable material, bonding or otherwise attaching a panel of a suitable material to an area of the rail 84, creating an aperture in the rail 84 and inserting a panel of suitable material in the aperture, or by other means. The material used to form the surface treatment area 96 may be any material to which the cleaning compound adheres better than the cleaning compound adheres to the remainder of the rail 84. For example, if the remainder of the leadframe 80''' including the leadframe rail 84 is formed from a nickel-based alloy, the material used to form the surface treatment area 96 may be copper since it has been found that conventional cleaning compounds adhere better to copper than they do to nickel-based alloys. Again, the surface treatment area 96 may be formed on either or both surfaces of the leadframe rail 84 depending on the locations of the vents 74 and the desired degree of adhesion between the leadframe rail 84 and the cleaning compound. As with the other embodiments, the increased adhesion between the cleaning compound and the area used to form the surface treatment area 96 results in little or no cleaning compound flash remaining in the vents 74 after the cleaning process.

It should also be mentioned there is no limit to the size of the cleaning compound attachment area 88. Although cleaning compound attachment areas 88 of relatively small size have been shown in FIGS. 4–7, it should be understood the cleaning compound attachment areas 88 may be substantially larger, including the entire area of the leadframe rails 82, 84 or larger area. What is important is that the leadframe rail 84 adjacent the vents 74 not be a smooth, unitary structure like the conventional leadframe rails 60, 62 shown in FIG. 3.

Figure 8:
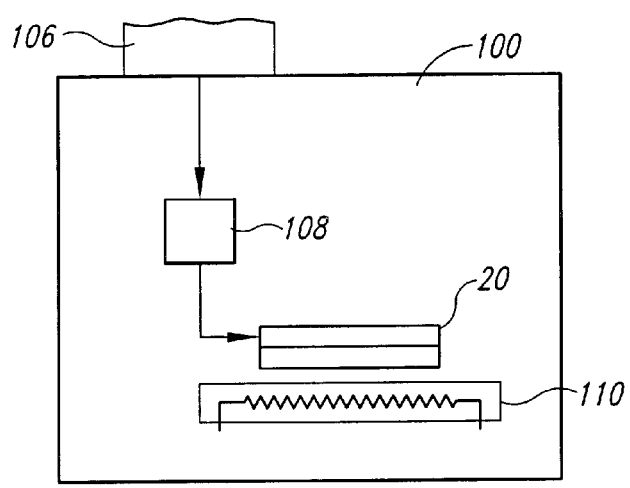
FIG. 8 is an isometric view of an injection molding machine using the leadframe of FIG. 4 according to the present invention.

One embodiment of a molding machine 100 using a mold 20 of the type shown in FIG. 2 and an embodiment of the leadframe 80 shown in FIGS. 4–7 is schematically shown in FIG. 8. The molding machine 100 is of conventional design, and includes a material reservoir 106 containing a supply of a material, such as molding, conditioning, or cleaning compound, that is to be injected into the mold 20. The molding machine 100 also includes an injection mechanism 108 for forcibly injecting the material from the material reservoir 106 into the mold 20. The molding machine 100 also includes a heating mechanism 110 for heating the mold 20. By using an embodiment of the leadframe 80 specially adapted to remove cleaning compound flash from vents, the downtime of the molding machine 100 is relatively low, and damage to the mold 20 and injury to workers is substantially avoided.

From the foregoing it will be appreciated that, although specific embodiments of the invention have been described herein for purposes of illustration, various modifications may be made without deviating from the spirit and scope of the invention. For example, although the various embodiments of flash removing leadframes have been described as being for the purpose of removing cleaning compound flash from mold vents, it should be understood they can also be used to remove the flash of other materials, such as molding compound and cleaning compound, from mold vents. Accordingly, the invention is not limited except as by the appended claims.

What is claimed is:

1. A method of cleaning debris from an injection mold used to mold integrated circuit packages, the mold having a plurality of mold cavities, a respective injection inlet adjacent each of the mold cavities, and a respective mold vent adjacent each of the mold cavities on adjacent an edge of the mold cavity opposite the injection inlet for the mold cavity; the method comprising:

placing a leadframe in the mold, the leadframe having a pair of leadframe rails extending along opposite sides of the leadframe with an attachment area formed on the leadframe rail adjacent each of the mold vents, each of the attachment areas comprising at least one aperture formed in the leadframe rail that cause the attachment area to adhere relatively well to a cleaning compound;

injecting the cleaning compound into the mold in a manner that permits some of the cleaning compound to enter at least some of the mold vents, thereby forming flash;

allowing the cleaning compound to solidify;

after the cleaning compound has solidified, removing the leadframe and cleaning compound, including any flash that has formed, as a unit; and returning the mold to service without manually scraping flash from any of the mold vents.

2. The method of claim 1 wherein a plurality of apertures are formed in the leadframe rail.

3. The method of claim 1 wherein the aperture has an elongated shape.

4. The method of claim 1 wherein the leadframe further comprises:

a plurality of integrated circuit attachment panels; and a plurality of leads extending from each of the integrated circuit attachment panels.

5. A method of cleaning debris from an injection mold used to mold integrated circuit packages, the mold having a plurality of mold cavities, a respective injection inlet adjacent each of the mold cavities, and a respective mold vent adjacent each of the mold cavities on adjacent an edge of the mold cavity opposite the injection inlet for the mold cavity; the method comprising placing a leadframe in the mold, the leadframe having a pair of leadframe rails extending along opposite sides of the leadframe with an attachment area formed on the leadframe rail adjacent each of the mold vents, each of the attachment areas comprising an area of a material on the leadframe rail that is different from a material used to form the remaining portion of the leadframe rail to cause the attachment area to adhere relatively well to a cleaning compound, each of the attachment areas further comprising at least one aperture formed in the leadframe rail;

injecting the cleaning compound into the mold in a manner that permits some of the cleaning compound to enter at least some of the mold vents, thereby forming flash;

allowing the cleaning compound to solidify;

after the cleaning compound has solidified, removing the leadframe and cleaning compound, including any flash that has formed, as a unit; and returning the mold to service without manually scraping flash from any of the mold vents.

6. The method of claim 5 wherein the attachment areas are formed on opposite surfaces of the leadframe rail.

7. The method of claim 5 wherein the attachment areas are formed on only one surface of the leadframe rail.

8. The method of claim 5 wherein respective attachment areas are formed on both of the leadframe rails.

9. The method of claim 5 wherein a plurality of apertures are formed in the leadframe rail.

10. The method of claim 5 wherein the aperture has an elongated shape.

11. The method of claim 5 wherein the area of material on the leadframe rail comprises an area of the material coating an area of the leadframe rail.

12. The method of claim 5 wherein the area of material on the leadframe rail comprises a panel of the material that is bonded to the leadframe rail.

13. The method of claim 5 wherein the area of material on the leadframe rail comprises a panel of the material that extends through the leadframe rail from one side of the leadframe rail to the other.

14. The method of claim 5 wherein the leadframe further comprises:

a plurality of integrated circuit attachment panels; and a plurality of leads extending from each of the integrated circuit attachment panels.

15. A method of manufacturing a leadframe so that the leadframe is specially adapted for removing flash from mold vents, the method comprising:

providing a leadframe having a pair of leadframe rails extending along opposite sides of the leadframe; and modifying an area on at least one of the leadframe rails so the area has properties that cause the area to adhere relatively well to a material forming the flash, the area being modified by creating an area of a material on the leadframe rail that is different from a material used to form the remaining portion of the leadframe rail, the act of modifying an area on at least one of the leadframe rails further comprising forming at least one aperture in the leadframe rail.

16. The method of claim 15 wherein the act of modifying an area on at least one of the leadframe rails comprises modifying a respective area on opposite surfaces of the leadframe rail.

17. The method of claim 15 wherein the act of modifying an area on at least one of the leadframe rails comprises modifying an area on only one surface of the leadframe rail.

18. The method of claim 15 wherein the act of modifying an area on at least one of the leadframe rails comprises modifying a respective area on both of the leadframe rails.

19. The method of claim 15 wherein the act of forming at least one aperture in the leadframe rail comprises forming a plurality of apertures in the leadframe rail.

20. The method of claim 15 wherein the act of forming at least one aperture in the leadframe rail comprises forming an aperture having an elongated shape.

21. The method of claim 15 wherein the act of treating an area of a surface of the leadframe rail comprises treating respective areas on opposite surfaces of the leadframe rail.

22. The method of claim 15 wherein the act of creating an area of a material on the leadframe rail that is different from a material used to form another portion of the leadframe comprises coating an area of the leadframe rail with the material.

23. The method of claim 15 wherein the act of creating an area of a material on the leadframe rail that is different from a material used to form another portion of the leadframe comprises bonding a panel of the material to the leadframe rail.

24. The method of claim 15 wherein the act of creating an area of a material on the leadframe rail that is different from a material used to form another portion of the leadframe comprises inlaying a panel of the material so that it extends through the leadframe rail from one side of the leadframe rail to the other.

25. A method of cleaning debris from an injection mold used to mold integrated circuit packages, the mold having a plurality of mold cavities, a respective injection inlet adjacent each of the mold cavities, and a respective mold vent adjacent each of the mold cavities on adjacent an edge of the mold cavity opposite the injection inlet for the mold cavity; the method comprising:

placing a leadframe in the mold, the leadframe having a pair of nickel-based alloy leadframe rails extending along opposite sides of the leadframe with an attachment area formed on the leadfraine rail adjacent each of the mold vents, each of the attachment areas being formed of copper to cause the attachment area to adhere relatively well to a cleaning compound;

injecting the cleaning compound into the mold in a manner that permits some of the cleaning compound to enter at least some of the mold vents, thereby forming flash;

allowing the cleaning compound to solidify;

after the cleaning compound has solidified, removing the leadframe and cleaning compound, including any flash that has formed, as a unit; and returning the mold to service without manually scraping flash from any of the mold vents.

26. The method of claim 25 wherein the attachment areas are formed on opposite surfaces of the leadframe rail.

27. The method of claim 25 wherein the attachment areas are formed on only one surface of the leadframe rail.

28. The method of claim 25 wherein respective attachment areas are formed on both of the leadframe rails.

29. A method of cleaning debris from an injection mold used to mold integrated circuit packages, the mold having a plurality of mold cavities, a respective injection inlet adjacent each of the mold cavities, and a respective mold vent adjacent each of the mold cavities on adjacent an edge of the mold cavity opposite the injection inlet for the mold cavity; the method comprising placing a leadframe in the mold, the leadframe having a pair of leadframe rails extending along opposite sides of the leadframe with an attachment area formed on the leadframe rail adjacent each of the mold vents, each of the attachment areas comprising an area of a material on the leadframe rail that is different from a material used to form the remaining portion of the leadframe rail to cause the attachment area to adhere relatively well to a cleaning compound, the area of material on the leadframe rail comprising a panel of the material that extends through the leadframe rail from one side of the leadframe rail to the other;

injecting the cleaning compound into the mold in a manner that permits some of the cleaning compound to enter at least some of the mold vents, thereby forming flash;

allowing the cleaning compound to solidify;

after the cleaning compound has solidified, removing the leadframe and cleaning compound, including any flash that has formed, as a unit; and returning the mold to service without manually scraping flash from any of the mold vents.

30. The method of claim 29 wherein the leadframe further comprises:

a plurality of integrated circuit attachment panels; and a plurality of leads extending from each of the integrated circuit attachment panels.

31. A method of manufacturing a leadframe so that the leadframe is specially adapted for removing flash from mold vents, the method comprising:

providing a leadframe having a pair of leadframe rails extending along opposite sides of the leadframe; and modifying an area on at least one of the leadframe rails so the area has properties that cause the area to adhere relatively well to a material forming the flash, the area being modified by creating an area of a material on the leadframe rail that is different from a material used to form the remaining portion of the leadframe rail, the act of creating an area of a material on the leadframe rail that is different from a material used to form another portion of the leadframe comprising inlaying a panel of the material so that it extends through the leadframe rail from one side of the leadframe rail to the other.

\* \* \* \* \*